United States Patent
Bayram et al.

(10) Patent No.: US 9,053,930 B2
(45) Date of Patent: Jun. 9, 2015

(54) HETEROGENEOUS INTEGRATION OF GROUP III NITRIDE ON SILICON FOR ADVANCED INTEGRATED CIRCUITS

(71) Applicant: International Business Machines Corporation, Armonk, NY (US)

(72) Inventors: Can Bayram, Ossining, NY (US); Cheng-Wei Cheng, White Plains, NY (US); Tak H. Ning, Yorktown Heights, NY (US); Devendra K. Sadana, Pleasantville, NY (US); Kuen-Ting Shiu, White Plains, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 13 days.

(21) Appl. No.: 13/736,535

(22) Filed: Jan. 8, 2013

(65) Prior Publication Data

US 2013/0270608 A1    Oct. 17, 2013

Related U.S. Application Data

(60) Provisional application No. 61/625,250, filed on Apr. 17, 2012.

(51) Int. Cl.
*H01L 21/20* (2006.01)
*H01L 21/02* (2006.01)
*H01L 29/20* (2006.01)

(52) U.S. Cl.
CPC ....... *H01L 21/02365* (2013.01); *H01L 29/2003* (2013.01); *H01L 21/02381* (2013.01); *H01L 21/0245* (2013.01); *H01L 21/02516* (2013.01);

(Continued)

(58) Field of Classification Search
None
See application file for complete search history.

(56) References Cited

U.S. PATENT DOCUMENTS 7,420,226 B2    9/2008    Augustine et al.
7,785,991 B2    8/2010    Joblot et al.
(Continued)

FOREIGN PATENT DOCUMENTS

FR    2908925    5/2008

OTHER PUBLICATIONS

Chung, J. W., et al., "On-Wafer Seamless Integration of GaN and Si (100) Electronics", Compound Semiconductor Integrated Circuit Symposium, 2009. CISC 2009. Annual IEEE, Oct. 11-14, 2009.
(Continued)

*Primary Examiner* — Scott B Geyer
(74) *Attorney, Agent, or Firm* — Scully, Scott, Murphy & Presser, P.C.; Louis J. Percello, Esq.

(57) ABSTRACT

Various methods to integrate a Group III nitride material on a silicon material are provided. In one embodiment, the method includes providing a structure including a (100) silicon layer, a (111) silicon layer located on an uppermost surface of the (100) silicon layer, a Group III nitride material layer located on an uppermost surface of the (111) silicon layer, and a blanket layer of dielectric material located on an uppermost surface of the Group III nitride material layer. Next, an opening is formed through the blanket layer of dielectric material, the Group III nitride material layer, the (111) Si layer and within a portion of the (100) silicon layer. A dielectric spacer is then formed within the opening. An epitaxial semiconductor material is then formed on an exposed surface of the (100) silicon layer within the opening and thereafter planarization is performed.

6 Claims, 8 Drawing Sheets

(52) U.S. Cl.
CPC ........ *H01L 21/0254* (2013.01); *H01L 21/0262* (2013.01); *H01L 21/02664* (2013.01); *H01L 21/2007* (2013.01)

(56) References Cited

U.S. PATENT DOCUMENTS

| | | | |
|---|---|---|---|
| 7,947,576 | B2 | 5/2011 | Igari et al. |
| 7,968,913 | B2 | 6/2011 | Hopper et al. |
| 8,129,205 | B2 | 3/2012 | Rana et al. |
| 8,183,667 | B2 | 5/2012 | Park |
| 8,278,125 | B2 | 10/2012 | Chen et al. |
| 2006/0289876 | A1 | 12/2006 | Briere |
| 2007/0238233 | A1* | 10/2007 | Sadaka et al. ............ 438/187 |
| 2008/0149936 | A1 | 6/2008 | Joblot et al. |
| 2009/0008647 | A1 | 1/2009 | Li et al. |
| 2009/0026473 | A1 | 1/2009 | Jiang et al. |
| 2009/0032842 | A1* | 2/2009 | Lagally et al. ............ 257/190 |
| 2011/0108850 | A1 | 5/2011 | Cheng et al. |
| 2011/0180857 | A1 | 7/2011 | Hoke et al. |
| 2011/0260210 | A1 | 10/2011 | Su |
| 2012/0205617 | A1 | 8/2012 | Pan et al. |

OTHER PUBLICATIONS

Lee et al. "Growth of GaN on a nanoscale-faceted Si substrate by metal-organic vapor-phase epitaxy", Applied Physics Letters, Sep. 3, 2001, vol. 79, No. 10.

Song, J.H., et al., "Nonpolar a-plane GaN film on Si(100) produced using a specially designed lattice-matched buffer: A fresh approach to eliminate the polarization effect", Journal of Applied Physics, Feb. 2005, 97, 043531.

Wan et al. "Growth of crack-free hexagonal GaN films on Si(100)", Physics, Applied Physics Letters, Sep. 2001 vol. 79, Issue 10, pp. 1459-1461.

\* cited by examiner

US 9,053,930 B2

HETEROGENEOUS INTEGRATION OF GROUP III NITRIDE ON SILICON FOR ADVANCED INTEGRATED CIRCUITS

RELATED APPLICATION

The present application claims benefit of U.S. Provisional Application Ser. No. 61/625,250, filed on Apr. 17, 2012, the entire content of which is incorporated herein by reference.

BACKGROUND

The present disclosure relates to various methods for integrating a Group III nitride on a silicon substrate, and various semiconductor structures that are formed using the methods of the present application.

Group III nitride materials are a unique group of semiconductor materials which can be used in a wide variety of applications including, for example, optoelectronics, photovoltaics and lighting. Group III nitrides are composed of nitrogen and at least one element from Group III, i.e., aluminum (Al), gallium (Ga) and indium (In), of the Periodic Table of Elements. Illustrative examples of some common Group III nitrides are GaN, AlN, InN, GaAlN, and GaAlInN. By changing the composition of Al, Ga and/or In within a Group III nitride, the Group III nitride can be tuned along the electromagnetic spectrum; mainly from 210 nm to 1770 nm. This spectrum includes the visible light emitting diode (LED), which is more than a 10 billion dollar industry with a forecasted double digit yearly growth rate. This continuous growth in LED demand enables the infrastructural build-up for the growth and fabrication of Group III nitride based semiconductor devices.

One of the bottlenecks for Group III nitride based semiconductor devices is a lack of a latticed matched substrate. Some of the conventional substrates are sapphire ($Al_2O_3$), silicon carbide (SiC), silicon (Si), and zinc oxide (ZnO) that have about 13%, 3%, 17% and 2%, respectively, lattice mismatch with GaN. Currently, lattice matched freestanding GaN and AlN substrates are being developed. However, lattice matched substrates suffer from availability and cost.

Most of the Group III nitride consumer-targeted devices are conventionally grown on sapphire substrates. There is, however, a need for the development of Group III nitride technology on more available and cheaper substrates such as silicon. The integration between Group III nitrides and silicon substrates is difficult because of the different crystal structure and lattice constant of those materials. As such, a method is needed which can be used to easily integrate Group III nitride materials and silicon substrates.

SUMMARY

One aspect of the present disclosure relates to various methods to integrate a Group III nitride material on a silicon material. In one embodiment of the present disclosure, the method includes providing a structure comprising, from bottom to top, a (100) silicon layer, a (111) silicon layer located on an uppermost surface of the (100) silicon layer, a Group III nitride material layer located on an uppermost surface of the (111) silicon layer, and a blanket layer of dielectric material located on an uppermost surface of the Group III nitride material layer. Next, an opening is formed through the blanket layer of dielectric material, the Group III nitride material layer, the (111) Si layer and partially within the (100) silicon layer, wherein a surface of the (100) silicon layer beneath the uppermost surface of the (100) silicon layer is exposed. Next, a conformal dielectric material liner is formed atop remaining portions of the blanket layer of dielectric material and within the opening. Horizontal portions of the conformal dielectric material liner are then removed to provide template dielectric spacers partially covering the exposed surface of the (100) silicon layer. An epitaxial semiconductor material layer is formed on a remaining portion of the exposed surface of the (100) silicon layer. Next, portions of the epitaxial semiconductor material layer, portions of the template dielectric spacers, and remaining portions of the blanket layer of dielectric material are removed to expose the uppermost surface of remaining portions of the Group III nitride material layer.

In another embodiment of the present disclosure, the method includes providing a structure comprising, from bottom to top, a (100) silicon layer, a (111) silicon layer located on an uppermost surface of the (100) silicon layer, a Group III nitride material layer located on an uppermost surface of the (111) silicon layer, and a blanket layer of dielectric material located on an uppermost surface of the Group III nitride material layer. An opening is formed through the blanket layer of dielectric material, and the Group III nitride material layer to expose a portion of the uppermost surface of the (111) silicon layer. An oxidation process is performed to form an oxide plug within the exposed portion of the (111) silicon layer, wherein a bottommost surface of the oxide plug contacts the uppermost surface of the (100) silicon layer. A conformal dielectric material liner is formed atop remaining portions of the blanket layer of dielectric material and within the opening. Horizontal portions of the conformal dielectric material liner and a portion of the oxide plug are removed to expose a portion of the uppermost surface of the (100) silicon layer. An epitaxial semiconductor material layer is formed on remaining exposed portions of the uppermost surface of the (100) silicon layer. Next, portions of the epitaxial semiconductor material layer, and remaining portions of the blanket layer of dielectric material are removed to expose the uppermost surface of remaining portions of the Group III nitride material layer.

In yet another embodiment of the present disclosure, the method of the present disclosure includes providing a structure comprising, from bottom to top, a (100) silicon layer, a buried insulator layer located on an uppermost surface of the (100) silicon layer, a (111) silicon layer located on an uppermost surface of the buried insulator layer, a Group III nitride material layer located on an uppermost surface of the (111) silicon layer, and a blanket layer of dielectric material located on an uppermost surface of the Group III nitride material layer. Next, an opening is formed through the blanket layer of dielectric material, and the Group III nitride material layer to expose a portion of the uppermost surface of the (111) silicon layer. A conformal dielectric material liner is formed atop remaining portions of the blanket layer of dielectric material and within the opening. Horizontal portions of the conformal dielectric material liner are removed to provide template dielectric spacers partially covering the exposed portion of the uppermost surface of the (100) silicon layer. An epitaxial semiconductor material layer is formed on remaining exposed portions of the uppermost surface of the (111) silicon layer. Next, portions of the epitaxial semiconductor material, portions of the template dielectric spacers and remaining portions of the blanket layer of dielectric material are removed to expose the uppermost surface of remaining portions of the Group III nitride material layer.

In a further embodiment of the present disclosure, the method of the present disclosure includes providing a structure comprising, from bottom to top, a layer of sapphire, a (100) silicon layer located on an uppermost surface of the layer of sapphire, and a blanket layer of dielectric material located on an uppermost surface of the (100) silicon layer. Next, an opening is formed within the structure to expose the uppermost surface of the layer of sapphire. A Group III nitride material layer is then from exposed sidewalls of the (100) silicon layer, and thereafter, portions of the Group III nitride material layer are removed from atop remaining portions of the blanket layer of dielectric material.

In another aspect of the present disclosure semiconductor structures are provided in which a Group III nitride material is integrated with a silicon layer. In one embodiment of the present disclosure, the semiconductor structure includes a (100) silicon layer having an uppermost surface; a patterned (111) silicon layer located on the uppermost surface of the (100) silicon layer; a patterned Group III nitride material layer located on an uppermost surface of the patterned (111) silicon layer; and an epitaxial semiconductor material layer located within an opening in the patterned (111) silicon layer and the patterned Group III nitride material layer. In accordance with this embodiment of the present disclosure, the epitaxial semiconductor material layer within the opening has a bottommost surface in direct contact with a portion of the (100) silicon layer, and an uppermost surface that is coplanar within the uppermost surface of the patterned Group III nitride material layer. Also, sidewall surfaces of the epitaxial semiconductor material layer are separated from sidewall surfaces of the patterned (111) silicon layer and the patterned Group III nitride material layer by a dielectric spacer.

In another embodiment, the semiconductor structure includes a (100) silicon layer having an uppermost surface; a buried insulator layer located on the uppermost surface of the (100) silicon layer; a (111) silicon layer located on an uppermost surface of the buried insulator layer; a patterned Group III nitride material layer located on an uppermost surface of the (111) silicon layer; and an epitaxial semiconductor material layer located within an opening in the patterned Group III nitride material layer. In accordance with this embodiment of the present disclosure, the epitaxial semiconductor material layer has a bottommost surface in direct contact with the uppermost surface of the (111) silicon layer, and an uppermost surface that is coplanar within the uppermost surface of the patterned Group III nitride material layer. Also, sidewall surfaces of the epitaxial semiconductor material layer are separated from sidewall surfaces of the patterned Group III nitride material layer by a dielectric spacer.

In yet another embodiment, the semiconductor structure includes a layer of sapphire; a patterned (100) silicon layer located on an uppermost surface of sapphire; and a Group III nitride material layer located within an opening in the patterned (100) silicon layer and located on portion of the uppermost surface of the layer of sapphire. Also, a portion of the Group III nitride material layer is in direct contact with sidewalls of the patterned (100) silicon layer.

DETAILED DESCRIPTION

The present disclosure, which relates to various methods for integrating a Group III nitride material with a silicon substrate, and various semiconductor structures that are formed using the methods of the present application, will now be described in greater detail by referring to the following discussion and drawings that accompany the present disclosure. It is noted that the drawings are provided for illustrative purposes only and are not drawn to scale.

In the following description, numerous specific details are set forth, such as particular structures, components, materials, dimensions, processing steps and techniques, in order to illustrate the present disclosure. However, it will be appreciated by one of ordinary skill in the art that various embodiments of the present disclosure may be practiced without these, or with other, specific details. In other instances, well-known structures or processing steps have not been described in detail in order to avoid obscuring the various embodiments of the present disclosure.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. When an element is referred to as being "directly contacting" or "in direct contact with" another element, there are no intervening elements present.

Figure 1:
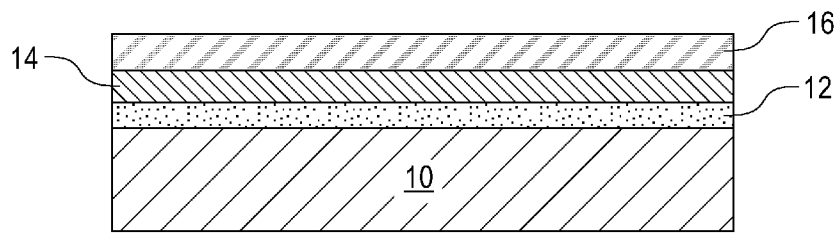
FIG. 1 is a pictorial representation (through a cross sectional view) illustrating a structure including at least a (100) silicon (Si) layer having a (111) silicon (Si) layer located on an uppermost surface thereof that can be employed in one embodiment of the present disclosure.

Referring to FIG. 1, there is illustrated a structure including at least a (100) silicon (Si) layer 14 having a (111) silicon (Si) layer 16 located on an uppermost surface thereof that can be employed in one embodiment of the present disclosure. The structure further includes a buried insulator layer 12 in contact with a bottommost surface of the (100) Si layer 14 and a handle substrate 10 located in contact with a bottommost surface of the buried insulator layer 12. In some embodiments, the buried insulator layer 12 and the handle substrate 10 are optional and thus can be omitted.

The term "(100) Si layer" denotes a silicon layer which has a (100) crystallographic surface orientation. The term "(111) Si layer" denotes a silicon layer which has a (111) crystallographic surface orientation. The (100) Si layer 14 and the (111) Si layer 16 are both single crystalline materials. Moreover, the (100) Si layer 14 and/or the (111) Si layer 16 can be doped, undoped or contain regions that are doped and other regions that are non-doped. The dopant may be an n-type dopant selected from an Element from Group VA of the Periodic Table of Elements (i.e., P, As and/or Sb) or a p-type dopant selected from an Element from Group IIIA of the Periodic Table of Elements (i.e., B, Al, Ga and/or In). The (100) Si layer 14 and/or the (111) Si layer 16 may contain one region that is doped with a p-type dopant and another region that is doped with an n-type dopant. The thickness of the (100) Si layer 14 and/or the (111) Si layer 16 can be from 1 nm to 100 µm, although lesser and greater thicknesses can also be employed.

The buried insulator layer 12 that can be present in some embodiments of the present disclosure may be comprised of a dielectric material including, for example, an oxide, a nitride, an oxynitride or any combination thereof. In one embodiment, the buried insulator layer 12 can be an oxide such as, for example, silicon oxide. The thickness of the buried insulator layer 12 can be from 5 nm to 100 nm, although lesser and greater thicknesses can also be employed.

The handle substrate 10 may comprise a semiconductor material, an insulator material, a conductive material or any combination thereof. The handle substrate 10 provides mechanical support to the buried insulator layer 12, the (100) Si layer 14 and the (111) Si layer 16. In one embodiment, the handle substrate 10 comprises a semiconductor material including, but not limited to, silicon, germanium, a silicon germanium alloy, a III-V compound semiconductor, a II-VI compound semiconductor or any combination thereof. The thickness of the handle substrate 10 can be from 50 microns to 2 cm, although lesser and greater thicknesses can also be employed.

The structure shown in FIG. 1 can be formed utilizing any conventional bonding process. For example and in one embodiment, the (100) Si layer 14 and the (111) Si layer 16 can be bonding directly together without the presence of the buried insulator layer 12, and the handle substrate 10. In other embodiments, a structure comprising the (100) Si layer 14, the buried insulator layer 12, and the handle substrate 10 can be bonded to the (111) Si layer. In some embodiments, the buried insulator layer 12 and the handle substrate 10 can remain within the bonded structure. In other embodiments, the buried insulator layer 12 and the handle substrate 10 can be removed by planarization and/or grinding.

Figure 2:
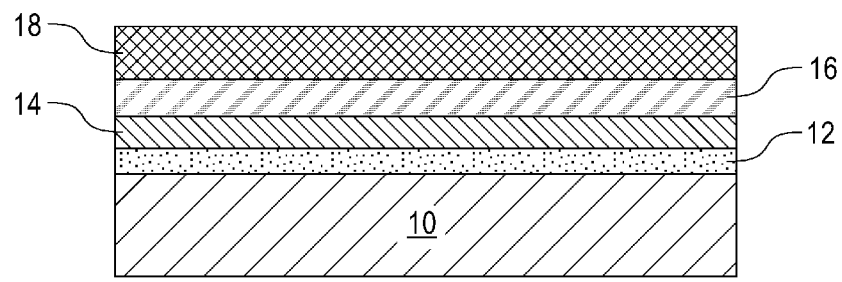
FIG. 2 is a pictorial representation (through a cross sectional view) illustrating the structure of FIG. 1 after forming a Group III nitride material layer on an uppermost surface of the (111) Si layer.

Referring now to FIG. 2, there is illustrated the structure of FIG. 1 after forming a Group III nitride material layer 18 on an uppermost surface of the (111) Si layer 16. The term "Group III nitride material layer" as used throughout the present disclosure denotes a compound or a structure that is composed of nitrogen and at least one element from Group III, i.e., aluminum (Al), gallium (Ga) and indium (In), of the Periodic Table of Elements. Illustrative examples of some common Group III nitride compounds are GaN, AlN, InN, GaInN, GaAlN, and GaAlInN. Illustrative examples of some common Group III nitride structures are AlGaN/GaN, GaN/AlGaN/GaN, and GaN/AlGaN/GaN/AlN. Such Group III nitride structures include heterostructures where there are at least two different Group III nitride layers grown on top of each other to create a 2D electron gas layer in the layer with lower bandgap material. In one embodiment of the present disclosure, the Group III nitride material layer 18 is a gallium-containing nitride material such as, for example, GaN, GaAlN, GaAlInN, and GaInN. Of the gallium-containing nitride materials, GaN is preferred in some embodiments of the present disclosure. Notwithstanding the composition of the Group III nitride material layer 18, the Group nitride material layer 18 is single crystal.

The deposition of the Group III nitride material layer 18 is performed by metalorganic chemical vapor deposition (MOCVD). The MOCVD process includes introducing a Group III-containing precursor and a nitride precursor into the reactor chamber of an MOCVD apparatus. In some embodiments, the Group III-containing precursor may be an organo-Group III containing compound, i.e., an organoaluminum compound, an organoindium compound, and/or an organogallium compound. In other embodiments, a Group III halide (typically a chloride) can be employed as the Group III-containing precursor. When an organo-Group III containing compound is employed, the Group III-containing precursor can be, for example, a trialkyl-Group III compound, wherein the alkyl contains from 1 to 6 carbon atoms. Examples of Group III compounds that can be employed in the present disclosure, include, but are not limited to, trimethylaluminum, triethylaluminum, tributylaluminum, trimethylgallium, triethylgallium, tributylgallium, trimethylindium, triethylindium, and/or tributylindium. Examples of nitride containing precursors that can be used include, for example, ammonium nitride.

An inert carrier gas may be present with one of the precursors used in forming the Group III nitride material layer 18, or an inert carrier gas can be present with both the precursors (i.e., Group III-containing precursor and a nitride precursor) used in forming the Group III nitride material layer 18. The deposition of the Group III nitride material layer 18 is typically performed at a temperature of 850° C. or greater. In one embodiment, the deposition of the Group III nitride material layer 18 typically occurs at a temperature from 900° C. to 1200° C. In another embodiment, the deposition of the Group III nitride material layer 18 typically occurs at a temperature from 1200° C. to 1400° C. Notwithstanding the temperature in which the Group III nitride material layer 18 is formed, the deposition of the Group III nitride material layer 18 is performed for a time period of 1 minute to 2 hours. The Group III nitride material layer 18 that is formed typically has a thickness from 100 nm to 10000 nm, with a thickness from 1500 nm to 3000 nm being even more typical.

Figure 3:
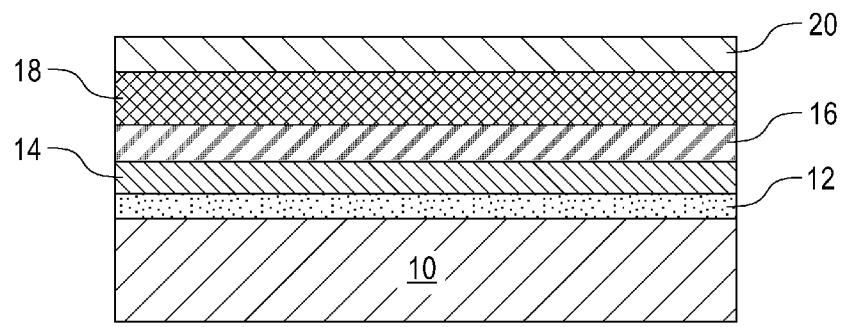
FIG. 3 is a pictorial representation (through a cross sectional view) illustrating the structure of FIG. 2 after forming a blanket layer of dielectric material on an uppermost surface of the Group III nitride material layer.

Referring now to FIG. 3, there is illustrated the structure of FIG. 2 after forming a blanket layer of dielectric material 20 on an uppermost surface of the Group III nitride material layer 18. As shown, the blanket layer of dielectric material 20 is a contiguous layer that covers the entire uppermost surface of the Group III nitride material layer 18. In some embodiments, the blanket layer of dielectric material 20 can be comprised of silicon oxide, silicon nitride, and/or silicon oxynitride. In one embodiment of the present disclosure, the blanket layer of dielectric material 20 can be formed onto the uppermost surface of the Group III nitride material layer 18 by utilizing a deposition process such as, for example, chemical vapor deposition, and plasma enhanced chemical vapor deposition. The thickness of the blanket layer of dielectric material 20 can be from 5 nm to 100 nm, although lesser and greater thicknesses can also be employed.

Figure 4:
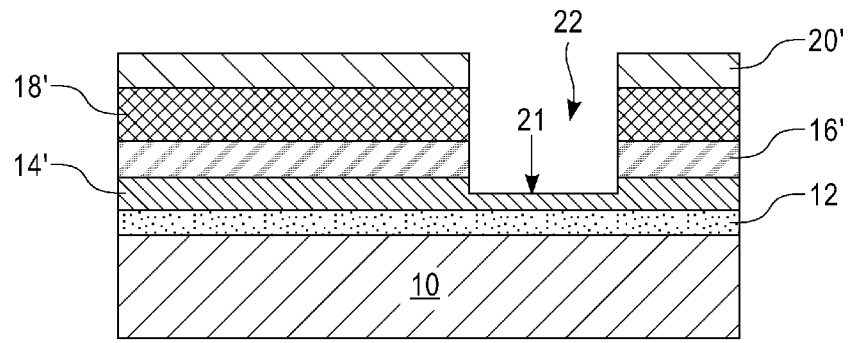
FIG. 4 is a pictorial representation (through a cross sectional view) illustrating the structure of FIG. 3 after forming an opening through the blanket layer of dielectric material, the Group III nitride material layer, the (111) Si layer and partially within the (100) Si layer exposing a surface of the (100) Si layer which is located beneath the uppermost surface of the (100) Si layer.

Referring to FIG. 4, there is illustrated the structure of FIG. 3 after forming an opening 22 through the blanket layer of dielectric material 20, the Group III nitride material layer 18, the (111) Si layer 16 and partially within the (100) Si layer 14. The opening 22 exposes a surface 21 of the now partially etched (100) Si layer 14' which is located beneath the uppermost surface of the original (100) Si layer 14. The remaining portions of the blanket layer of dielectric material 20, the Group III nitride material layer 18, and the (111) Si layer 16 are labeled as 20', 18', and 16', respectively. It is noted that the present disclosure is not limited to forming a single opening within the structure shown in FIG. 3. Instead, a plurality of such openings can be formed into the structure. Each of the openings that are formed expose a surface 21 of the partially etched (100) Si layer 14' that is located beneath an uppermost surface of the original (100) Si layer 14.

The opening 22 can be formed by lithography and etching. The lithographic step used in forming the opening 22 includes applying a blanket layer of a photoresist material on the uppermost surface of the blanket layer of dielectric material, exposing the photoresist material to radiation and developing the exposed photoresist material. The etching step used in forming the opening 22 may include a dry etching process, a chemical wet etching process or any combination thereof. When a dry etching process is employed, one of reactive ion etching, plasma etching, and ion beam etching can be used. When a chemical wet etch process is employed, a chemical etchant that selectively removes exposed portions of the blanket layer of dielectric material is used. After the etching process has been performed, the patterned photoresist material is stripped from the structure utilizing a conventional resist stripping process such as, for example, ashing.

In addition to exposing surface 21, the opening 22 also exposes sidewall surfaces of the remaining portions of the blanket layer of dielectric material 20', the remaining portions of the Group III nitride material layer 18', the remaining portions of the (111) Si layer 16' and the partially etched (100) Si layer 14'. Opening 22 that is formed has an aspect ratio (height to width ratio) of 1:1 or greater, with an aspect ratio of 3 to 1 being more typical.

Figure 5:
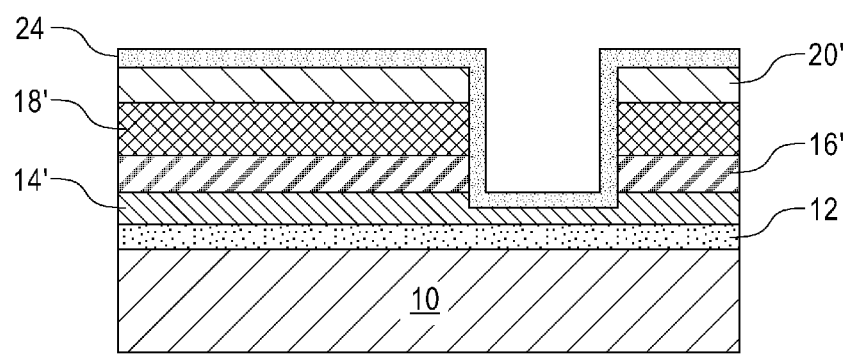
FIG. 5 is a pictorial representation (through a cross sectional view) illustrating the structure of FIG. 4 after forming a conformal dielectric material liner.

Referring to FIG. 5, there is illustrated the structure of FIG. 4 after forming a conformal dielectric material liner 24 on all exposed surfaces of the structure. Specifically, the conformal dielectric material liner 24 is formed on the exposed uppermost surface of the remaining portions of the blanket layer of dielectric material 20', the exposed sidewall surfaces of the remaining portions of the blanket layer of dielectric material 20', the remaining portions of the Group III nitride material layer 18', remaining portions of the (111) Si layer 16' and the partially etched (100) Si layer 14' and on the exposed surface 21.

The conformal dielectric material liner 24 may comprise a dielectric oxide, dielectric nitride, and/or dielectric oxynitride. In one embodiment of the present disclosure, the dielectric material liner 24 comprises silicon oxide or silicon nitride. The conformal dielectric material liner 24 can be formed utilizing a conformal deposition process such as, for example, chemical vapor deposition, plasma enhanced chemical vapor deposition or atomic layer deposition. By "conformal" it is meant that the deposition provides a film that defines a morphologically uneven interface with another body and has a thickness that is substantially the same (i.e., ±10 Angstroms) everywhere along the interface. The thickness of the conformal dielectric material liner 24 can be from 2 nm to 5 nm, although lesser and greater thicknesses can also be employed.

Figure 6:
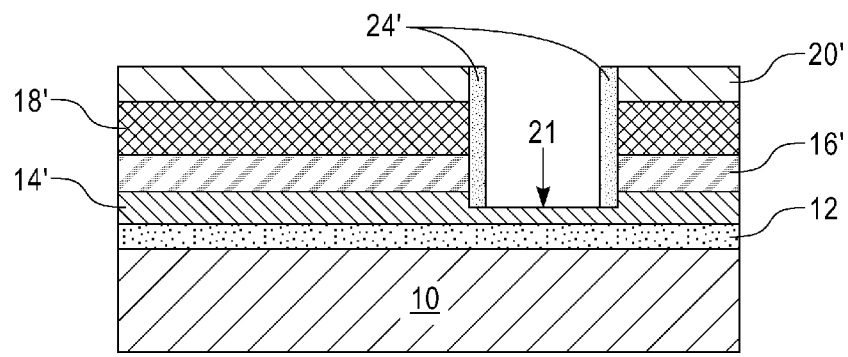
FIG. 6 is a pictorial representation (through a cross sectional view) illustrating the structure of FIG. 5 after removing horizontal portions of the conformal dielectric material liner from the structure to provide template dielectric spacers covering a portion of the exposed surface of the (100) Si layer that is located beneath the uppermost surface of the (100) Si layer.

Referring to FIG. 6, there is illustrated the structure of FIG. 5 after removing horizontal portions of the conformal dielectric material liner 24 from the structure to re-expose a portion of surface 21 of the partially etched (100) Si layer 14' that is located beneath the uppermost surface of the (100) Si layer. The removal of horizontal portions of the dielectric material liner 24 can be performed utilizing an anisotropic (i.e., directional) etching process such as, for example, reactive ion etching (RIE). The remaining portions of the dielectric material liner 24 that are present within the opening 22 and on the exposed sidewall surfaces of the remaining portions of the blanket layer of dielectric material 20', the remaining portions of the Group III nitride material layer 18', the remaining portions of the (111) Si layer 16' and the partially etched (100) Si layer 14 can be referred to as template dielectric spacers 24'.

Figure 7:
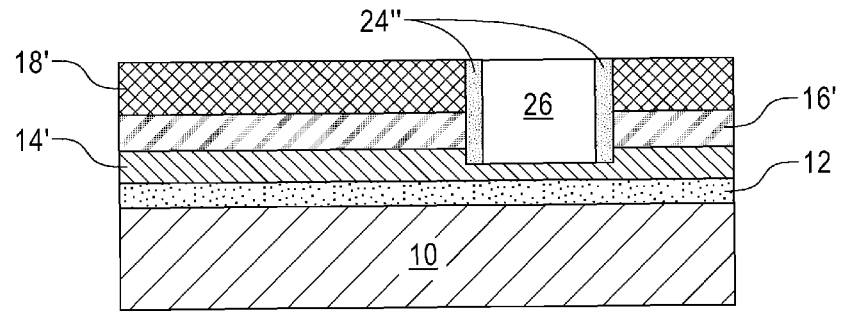
FIG. 7 is a pictorial representation (through a cross sectional view) illustrating the structure of FIG. 6 after growing an epitaxial semiconductor material layer on remaining portions of the exposed surface of the (100) Si layer that is located beneath the uppermost surface of the (100) Si layer and planarization.

Referring to FIG. 7, there is illustrated the structure of FIG. 6 after growing an epitaxial semiconductor material layer from the re-exposed portion of surface 21 of the partially etched (100) Si layer that is located beneath the uppermost surface of the (100) Si layer and planarization. The epitaxial semiconductor material layer that remains after the planarization is labeled as element 26 in the drawings of the present application.

Epitaxially growing, epitaxial growth and/or deposition" mean the growth of a semiconductor material on a deposition surface of a semiconductor material, in which the semiconductor material being grown has the same crystalline characteristics as the semiconductor material of the deposition surface. In the present embodiment, the semiconductor material has the same crystalline characteristics as that of the physically exposed surface 21 of the partially etched (100) Si layer 14'. When the chemical reactants are controlled and the system parameters set correctly, the depositing atoms arrive at the deposition surface with sufficient energy to move around on the surface and orient themselves to the crystal arrangement of the atoms of the deposition surface. Thus, an epitaxial film deposited on a {100} crystal surface will take on a {100} orientation. In some embodiments, the epitaxial deposition process is a selective deposition process.

The semiconductor material that can be epitaxially deposited and provides epitaxial semiconductor material layer 26 includes any semiconductor material such as, for example, silicon (Si), germanium (Ge), and silicon germanium (SiGe). In one embodiment, the semiconductor material includes a same semiconductor material as that of the partially etched (100) Si layer 14'. In another embodiment, the semiconductor material includes a different semiconductor material as that of the partially etched (100) Si layer 14'. It is noted that the specific material compositions for the semiconductor material that provides epitaxial semiconductor material layer 26 are provided for illustrative purposes only, and are not intended to limit the present disclosure, as any semiconductor material that may be formed using an epitaxial growth process.

A number of different sources may be used for the deposition of semiconductor material used in forming the epitaxial semiconductor material of epitaxial semiconductor material layer 26. In some embodiments, in which the semiconductor material of the epitaxial semiconductor material layer 26 is composed of silicon, the silicon gas source for epitaxial deposition may be selected from the group consisting of hexachlorodisilane ($Si_2Cl_6$), tetrachlorosilane ($SiCl_4$), dichlorosilane ($Cl_2SiH_2$), trichlorosilane ($Cl_3SiH$), methylsilane (($CH_3$)$SiH_3$), dimethylsilane (($CH_3$)$_2SiH_2$), ethylsilane (($CH_3CH_2$)$SiH_3$), methyldisilane (($CH_3$)$Si_2H_5$), dimethyldisilane (($CH_3$)$_2Si_2H_4$), hexamethyldisilane (($CH_3$)$_6Si_2$) and combinations thereof. In some embodiments, in which semiconductor material of epitaxial semiconductor material layer 26 is composed of germanium, the germanium gas source for epitaxial deposition may be selected from the group consisting of germane ($GeH_4$), digermane ($Ge_2H_6$), halogermane, dichlorogermane, trichlorogermane, tetrachlorogermane and combinations thereof. In some embodiments, in which the semiconductor material of epitaxial semiconductor material layer 26 is composed of silicon germanium, the silicon sources for epitaxial deposition may be selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof, and the germanium gas sources may be selected from the group consisting of germane, digermane, halogermane, dichlorogermane, trichlorogermane, tetrachlorogermane and combinations thereof.

The temperature for epitaxial semiconductor deposition typically ranges from 550° C. to 900° C. Although higher temperature typically results in faster deposition, the faster deposition may result in crystal defects and film cracking. The apparatus for performing the epitaxial growth may include a chemical vapor deposition (CVD) apparatus, such as atmospheric pressure CVD (APCVD), low pressure CVD (LPCVD), plasma enhanced CVD (PECVD), metal-organic CVD (MOCVD) and others. The epitaxial semiconductor material of epitaxial semiconductor material layer 26 that is deposited can be doped or undoped. By "undoped" it is meant that the maximum dopant concentration of p-type or n-type dopants that are present in the epitaxial semiconductor material is less than $5\times10^{15}$ atoms/cm$^3$.

Following the epitaxial growth of semiconductor material, a planarization process such as chemical mechanical polishing and/or grinding can be used to provide the planar structure shown in FIG. 7. The planarization process removes the remaining portions of the blanket layer of dielectric material 20', an upper portion of template dielectric spacers 24', and portions of the epitaxial semiconductor material layer 26 stopping on an uppermost surface of the remaining portions of the Group III nitride material layer 18'. Portions of the template spacer 24' remain after the planarization process; the remaining portions of the template spacer 24' are referred to herein as dielectric spacers 24".

FIG. 7 illustrates one structure that can be formed in the present disclosure. The structure illustrated in FIG. 7 includes (100) silicon layer (i.e. partially etch (100) Si layer 14') having an uppermost surface; a patterned (111) silicon layer (i.e., remaining portions of the (111) Si layer 16') located on the uppermost surface of the (100) silicon layer; a patterned Group III nitride material layer (i.e., remaining portions of the Group III nitride material layer 18') located on an uppermost surface of the patterned (111) silicon layer; and an epitaxial semiconductor material layer 26 located within an opening in the patterned (111) silicon layer and the patterned Group III nitride material layer. The epitaxial semiconductor material layer 26 has a bottommost surface in direct contact with a portion (i.e., surface 21) of the (100) silicon layer, and an uppermost surface that is coplanar within the uppermost surface of the patterned Group III nitride material layer 18'. Also, sidewall surfaces of the epitaxial semiconductor material layer 26 are separated from sidewall surfaces of the patterned (111) silicon layer and the patterned Group III nitride material layer 18' by a dielectric spacer 24".

Figure 8:
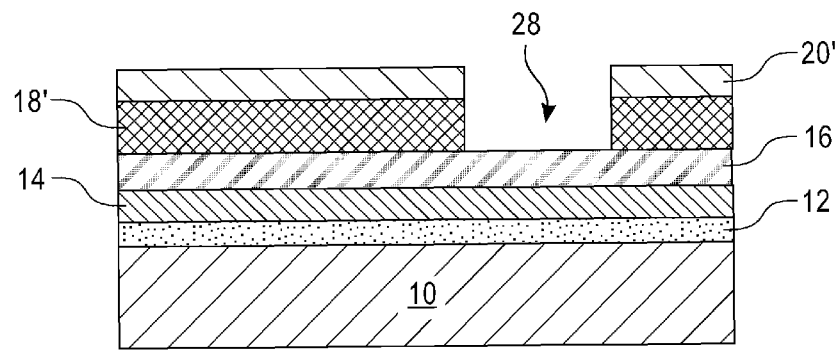
FIG. 8 is pictorial representation (through a cross sectional view) illustrating the structure of FIG. 3 after forming an opening through the blanket layer of dielectric material, and the Group III nitride material so as to expose a portion of the uppermost surface of the (111) Si layer.

Referring now to FIG. 8, there is illustrated the structure of FIG. 3 after forming an opening 28 through the blanket layer of dielectric material 20, and the Group III nitride material layer 18 so as to expose a portion of the uppermost surface of the (111) Si layer 16. In the drawing, the remaining portions of the blanket layer of dielectric material 20, and remaining portions of the Group III nitride material layer 18 are labeled as 20' and 18', respectively. Opening 28 is formed using the technique, i.e., lithography and etching, which was used in forming opening 22 in the structure shown in FIG. 4 of the present application. Opening 28 can have an aspect ratio within the range mentioned above for opening 22. In this embodiment, the opening 28 also exposes sidewall surfaces of the remaining portions of the blanket dielectric material 20', and remaining portions of the Group III nitride material layer 18'.

Figure 9:
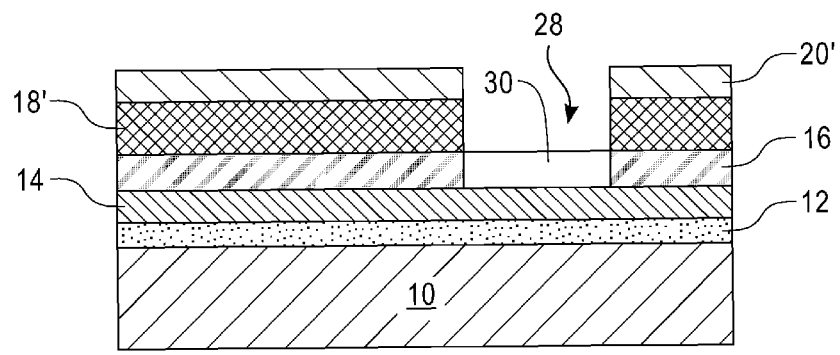
FIG. 9 is a pictorial representation (through a cross sectional view) illustrating the structure of FIG. 8 after performing an oxidation process to provide an oxide plug within the (111) Si layer, the oxide plug having a bottommost surface in direct contact with a portion of the uppermost surface of the (100) Si layer.

Referring now to FIG. 9, there illustrated the structure of FIG. 8 after performing an oxidation process to provide an oxide plug 30 within the (111) Si layer 16. As shown, oxide plug 30 has a bottommost surface in direct contact with a portion of the uppermost surface of the (100) Si layer 14. The oxide plug 30 can be formed by performing a thermal oxidation process to the structure shown in FIG. 8. The thermal oxidation process can be performed by heating the structure shown in FIG. 8 in an oxidizing ambient at a temperature of 700° C. or greater. The oxide plug 30 has a width that is substantially the same as the width of the opening 28. By "substantially the same" it is meant the width of the oxide plug is within ±100 Å from each sidewall surface. The oxide plug 30 is comprised of silicon oxide and thus is now a dielectric material.

Figure 10:
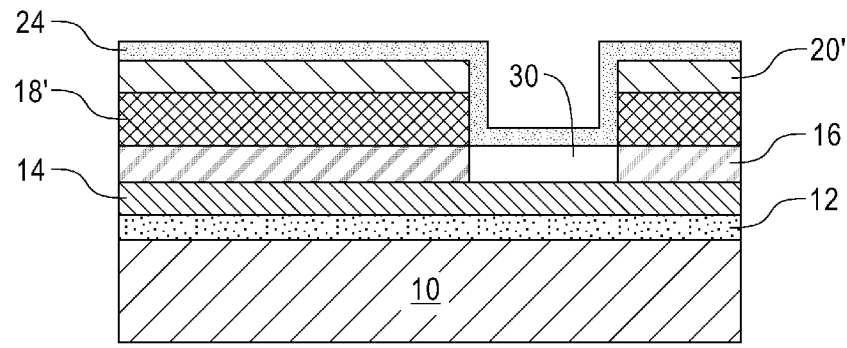
FIG. 10 is a pictorial representation (through a cross sectional view) illustrating the structure of FIG. 9 after forming a conformal dielectric material liner.

Referring to FIG. 10, there is illustrated the structure of FIG. 9 after forming a conformal dielectric material liner 24 on all exposed surfaces including atop the exposed surfaces of the remaining portions of the blanket layer of dielectric material 20', the exposed sidewall surfaces of the remaining portions of the blanket layer of dielectric material 20' and the remaining portions of the Group III nitride material layer 18' and atop an exposed horizontal surface of the oxide plug 30. The conformal dielectric material liner 24 used in this embodiment of the present disclosure is the same as that mentioned above in FIG. 5 of the present disclosure.

Figure 11:
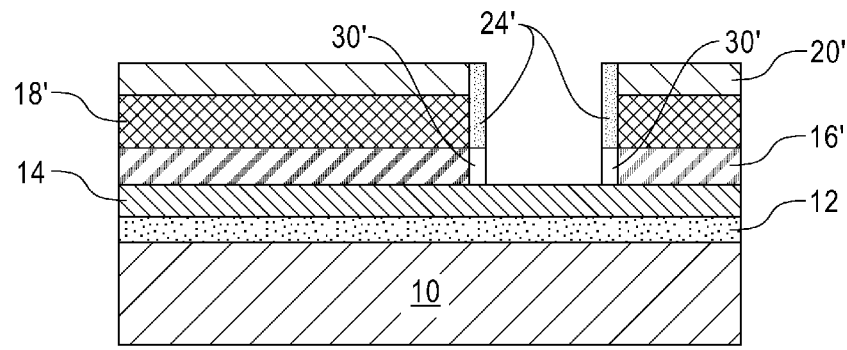
FIG. 11 is a pictorial representation (through a cross sectional view) illustrating the structure of FIG. 10 after removing horizontal portions of the conformal dielectric material liner and portions of the oxide plug from the structure to expose a portion of the uppermost surface of the (100) Si layer.

Referring to FIG. 11, there is illustrated the structure of FIG. 10 after removing horizontal portions of the conformal dielectric material liner 24 and portions of the oxide plug 30 from the structure to expose a portion of the uppermost surface of the (100) Si layer 16. The removal of the horizontal portions of the conformal dielectric material liner 24 and portions of the oxide plug 30 can be performed utilizing an anisotropic etch process, such as a reactive ion etch. In the drawings, the remaining portions of the conformal dielectric material liner 24 that are located on the exposed sidewall surfaces of the remaining portions of the blanket layer of dielectric material 20' and the remaining portions of the Group III nitride material layer 18' are referred to herein as template dielectric spacers 24', while the remaining portions of the oxide plug 30, which are located directly beneath the template dielectric spacers 24', are referred to herein as oxide spacers 30'.

Figure 12:
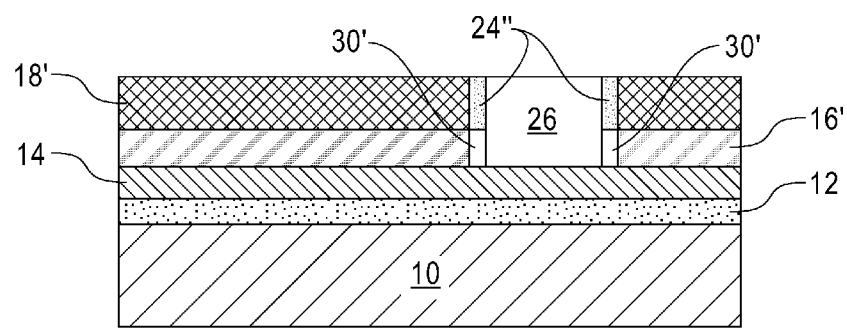
FIG. 12 is a pictorial representation (through a cross sectional view) illustrating the structure of FIG. 11 after growing an epitaxial semiconductor material layer on the exposed portion of the uppermost surface of the (100) Si layer and planarization.

Referring to FIG. 12, there is illustrated the structure of FIG. 11 after growing an epitaxial semiconductor material layer from the exposed portion of the uppermost surface of the (100) Si layer and planarization. The epitaxial semiconductor material layer can be formed utilizing the epitaxial growth process mentioned above in forming the structure shown in FIG. 7 of the present disclosure and one of the planarization process mentioned above in forming the structure shown in FIG. 7 can be employed herein in forming the structure shown in FIG. 12. The remaining portion of the epitaxial semiconductor material layer after planarization is labeled as element 26 in the drawing. After planarization a remaining portion of the template spacer 24' remains forming an upper dielectric spacer 24". In this embodiment, oxide spacer 30' and the upper dielectric spacer 24" can be collectively referred to as a composite spacer. The composite spacer includes a bottom oxide spacer portion (i.e., element 30') and an upper dielectric material spacer portion (i.e., element 24").

FIG. 12 illustrates another structure that can be formed in the present disclosure. The structure illustrated in FIG. 12 includes (100) silicon layer 14 having an uppermost surface; a patterned (111) silicon layer (i.e., remaining portions of the (111) Si layer 16') located on the uppermost surface of the (100) silicon layer; a patterned Group III nitride material layer (i.e., remaining portions of the Group III nitride material layer 18') located on an uppermost surface of the patterned (111) silicon layer; and an epitaxial semiconductor material layer 26 located within an opening in the patterned (111) silicon layer and the patterned Group III nitride material layer. The epitaxial semiconductor material layer 26 has a bottommost surface in direct contact with a portion of the uppermost surface of the (100) silicon layer and an uppermost surface that is coplanar within the uppermost surface of the patterned Group III nitride material layer. Also, sidewall surfaces of the epitaxial semiconductor material layer 26 are separated from sidewall surfaces of the patterned (111) silicon layer and the patterned Group III nitride material layer by a dielectric spacer (24', 30").

Figure 13:
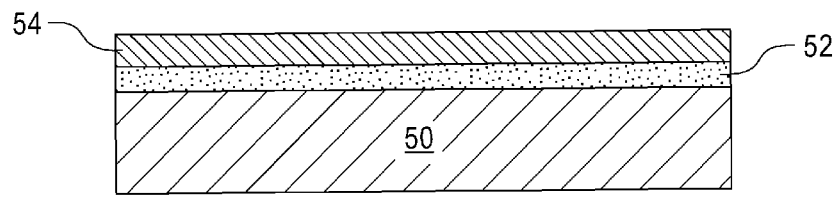
FIG. 13 is a pictorial representation (through a cross sectional view) illustrating a silicon-on-insulator substrate that includes, from bottom to top, a (100) Si layer, a buried insulator layer, and a (111) Si layer that can be employed in another embodiment of the present disclosure.

Referring now to FIG. 13, there is illustrated a silicon-on-insulator substrate that can be employed in some embodiments of the present disclosure. The silicon-on-insulator substrate includes, from bottom to top, a (100) Si layer 50, a buried insulator layer 52, and a (111) Si layer 54. The (100) Si layer 50 can have a thickness within the range mentioned above for the (100) Si layer 14, and the (111) Si layer 54 can have a thickness within the range mentioned above for (111) Si layer 16. The buried insulator layer 52 can be comprised of one of the dielectric materials, and have a thickness within the range, as mentioned above for buried insulator layer 12. The silicon-on-insulator substrate shown in FIG. 13 can be formed by wafer bonding.

Figure 14:
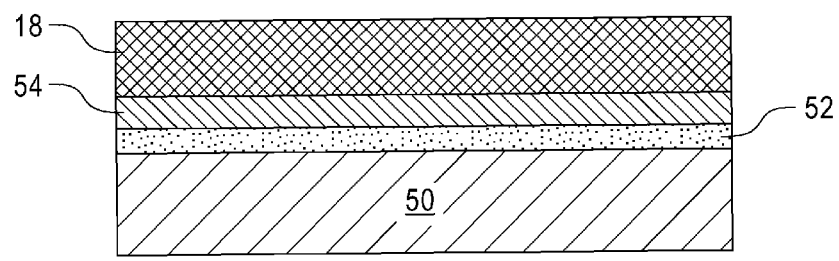
FIG. 14 is a pictorial representation (through a cross sectional view) illustrating the structure of FIG. 13 after forming a Group III nitride material layer on an uppermost surface of the (111) Si l layer.

Referring now to FIG. 14, there is illustrated the structure of FIG. 13 after forming a Group III nitride material layer 18 on an uppermost surface of the (111) Si layer 54. The Group III nitride material layer 18 of this embodiment of the present disclosure is the same as described above in connection with FIG. 2 of the present disclosure.

Figure 15:
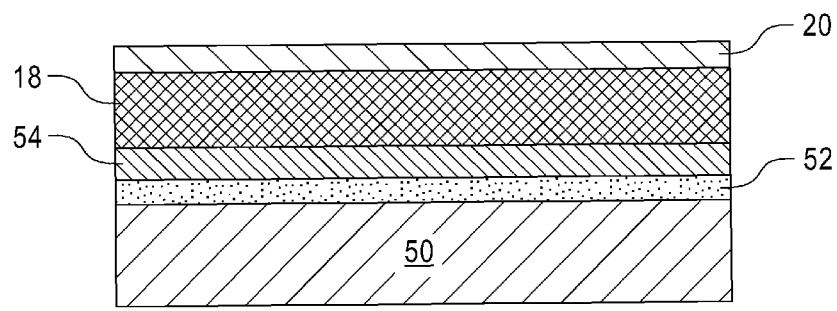
FIG. 15 is a pictorial representation (through a cross sectional view) illustrating the structure of FIG. 14 after forming a blanket layer of dielectric material on an uppermost surface of the Group III nitride material layer.

Referring now to FIG. 15, there is illustrated the structure of FIG. 14 after forming a blanket layer of dielectric material 20 on an uppermost surface of the Group III nitride material layer 18. The blanket layer of dielectric material 20 of this embodiment of the present disclosure is the same as described above in connection with FIG. 3 of the present disclosure.

Figure 16:
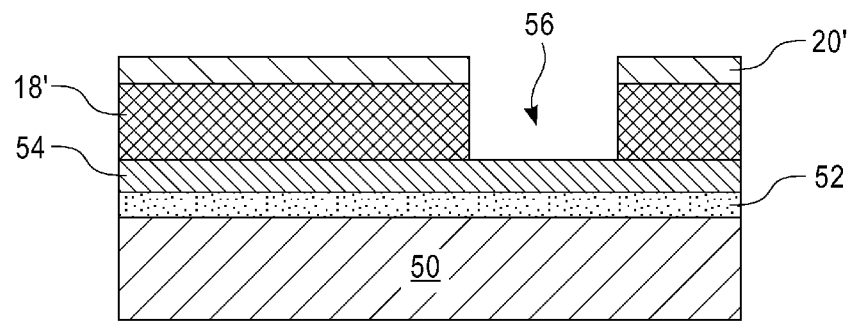
FIG. 16 is a pictorial representation (through a cross sectional view) illustrating the structure of FIG. 15 after forming an opening through the blanket layer of dielectric material, and the Group III nitride material layer exposing a portion of the uppermost surface of the Si (111) material layer.

Referring now to FIG. 16, there is illustrated the structure of FIG. 15 after forming an opening 56 through the blanket layer of dielectric material 20, and the Group III nitride material layer 18 exposing a portion of the uppermost surface of the Si (111) material layer 54. In the drawing, the remaining portions of the blanket layer of dielectric material 20, and remaining portions of the Group III nitride material 18 are labeled as 20' and 18', respectively. Opening 56 is formed using the technique, i.e., lithography and etching, which was used in forming opening 22 in the structure shown in FIG. 4 of the present application. Opening 56 can have an aspect ratio within the range mentioned above for opening 22. In this embodiment, the opening 56 also exposes sidewall surfaces of the remaining portions of dielectric material 20', and remaining portions of the Group III nitride material 18'.

Figure 17:
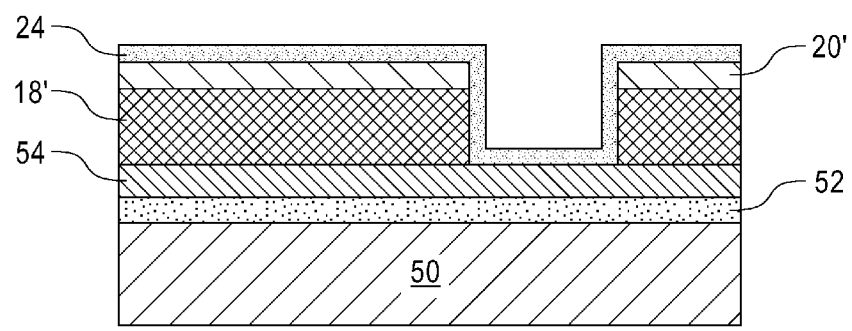
FIG. 17 is a pictorial representation (through a cross sectional view) illustrating the structure of FIG. 16 after forming a conformal dielectric material liner.

Referring now to FIG. 17, there is illustrated the structure of FIG. 16 after forming a conformal dielectric material liner 24 on all exposed surfaces including atop the exposed surfaces of the remaining portions of the blanket layer of dielectric material 20', the exposed sidewall surfaces of the remaining portions of the blanket layer of dielectric material 20' and the remaining portions of the Group III nitride material layer 18' and atop an exposed uppermost surface of the (111) Si layer 54. The conformal dielectric material liner 24 used in this embodiment of the present disclosure is the same as that mentioned above in FIG. 5 of the present disclosure.

Figure 18:
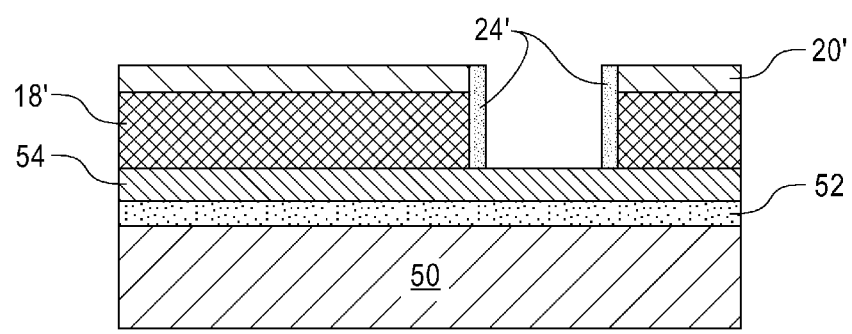
FIG. 18 is a pictorial representation (through a cross sectional view) illustrating the structure of FIG. 17 after removing horizontal portions of the conformal dielectric material liner from the structure to re-expose a portion of the uppermost surface of the (111) Si layer.

Referring to FIG. 18, there is illustrated the structure of FIG. 17 after removing horizontal portions of the conformal dielectric material liner 24 from the structure to re-expose a portion of the uppermost surface of the (111) Si layer 18. The removal of the horizontal portions of the conformal dielectric material liner 24 can be performed utilizing anisotropic etch process, such as a reactive ion etch. In the drawings, the remaining portions of the conformal dielectric material liner 24 that are located on the exposed sidewall surfaces of the remaining portions of the blanket layer of dielectric material 20' and the remaining portions of the Group III nitride material layer 18' are referred to herein as template dielectric spacers 24'.

Figure 19:
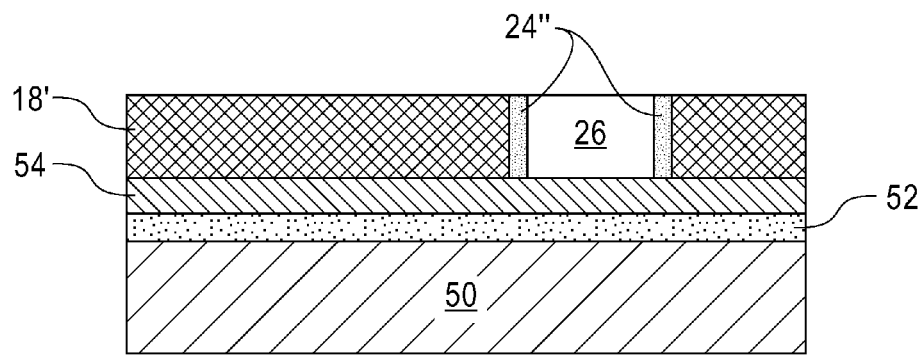
FIG. 19 is a pictorial representation (through a cross sectional view) illustrating the structure of FIG. 18 after growing an epitaxial semiconductor material layer from the re-exposed portion of the uppermost surface of the (111) Si layer and planarization.

Referring now to FIG. 19, there is illustrated the structure of FIG. 18 after growing an epitaxial semiconductor material layer from the re-exposed portion of the uppermost surface of the (111) Si layer 54 and planarization. The epitaxial semiconductor material layer can be formed utilizing the epitaxial growth process mentioned above in forming the structure shown in FIG. 7 of the present disclosure and one of the planarization process mentioned above in forming the structure shown in FIG. 7 can be employed herein in forming the structure shown in FIG. 19. The remaining portion of the epitaxial semiconductor material layer after planarization is labeled as element 26 in the drawing. After planarization portions of the template spacer 24' remains forming dielectric spacers 24".

FIG. 19 illustrates yet another semiconductor structure that can be formed in the present disclosure. In this embodiment, and as shown in FIG. 19, the structure that is provided includes a (100) silicon layer 50 having an uppermost surface; a buried insulator layer 52 located on the uppermost surface of the (100) silicon layer 50; a (111) silicon layer 54 located on an uppermost surface of the buried insulator layer 52; a patterned Group III nitride material (i.e., remaining portions 18' located on an uppermost surface of the (111) silicon layer 54; and an epitaxial semiconductor material layer 26 located within an opening in the patterned Group III nitride material layer 18'). As shown in FIG. 19, the epitaxial semiconductor material layer 26 has a bottommost surface in direct contact with the uppermost surface of the (111) silicon layer 54 and an uppermost surface that is coplanar within the uppermost surface of the patterned Group III nitride material layer (i.e., remaining portions 18'). Also, sidewall surfaces of the epitaxial semiconductor material layer 26 are separated from sidewall surfaces of the patterned Group III nitride material layer by a dielectric spacer 24".

After forming the structure shown in FIG. 7, 12, or 19, semiconductor devices (not shown) such as, for example, field effect transistors (FET), photonic devices (i.e., light emitting diodes or laser diodes) and combinations thereof, can be formed using conventional process that are well known to those skilled in the art. In some embodiments, the semiconductor devices can be formed upon and within the Group III nitride material layer 18' and/or the epitaxial semiconductor material layer 26. When FETs are formed upon and within the Group III nitride material layer 18', a portion of the Group III nitride material layer 18' can serve as a device channel and a gate stack including at least a gate dielectric material and gate electrode can be formed above the device channel utilizing conventional silicon complementary metal oxide semiconductor (CMOS)-like processes. When FETs are formed upon and within the epitaxial semiconductor material layer 26, a portion of the epitaxial semiconductor material layer 26 can serve as a device channel and a gate stack including at least a gate dielectric material and gate electrode can be formed above the device channel utilizing conventional silicon complementary metal oxide semiconductor (CMOS)-like processes.

Figure 20:
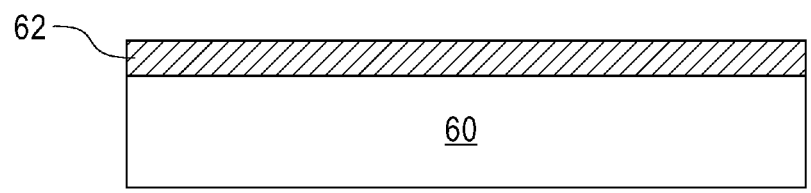
FIG. 20 is a pictorial representation (through a cross sectional view) illustrating a (100) Si layer on a sapphire substrate that can be employed in another embodiment of the present disclosure.

Referring now to FIG. 20, there is illustrated another structure that can be employed in yet another embodiment of the present disclosure. Specifically, the structure shown in FIG. 20 is a silicon-on-sapphire structure which includes a (100) Si layer 62 on a sapphire substrate 60. The (100) Si layer 62 can have a thickness with the range mentioned above for the (100) Si layer 14. The thickness of the sapphire substrate 60 can be from 50 microns to 2 cm, although lesser and greater thicknesses can also be employed. The silicon-on-sapphire structure can be formed by bonding or any other technique known to those skilled in the art that is capable of forming such a layered structure.

Figure 21:
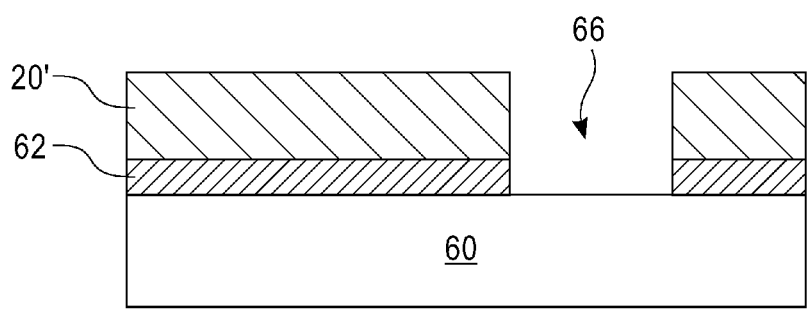
FIG. 21 is a pictorial representation (through a cross sectional view) illustrating the structure of FIG. 20 after forming a blanket layer of dielectric material on an uppermost surface of the (100) Si layer and after forming an opening through the blanket layer of dielectric material and the (100) Si layer to expose a portion of the uppermost surface of the sapphire substrate.

Referring now to FIG. 21, there is illustrated the structure of FIG. 20 after forming a blanket layer of dielectric material on an uppermost surface of the (100) Si layer and after forming an opening 66 through the blanket layer of dielectric material and the (100) Si layer to expose a portion of the uppermost surface of the sapphire substrate. The remaining portions of the blanket layer of dielectric material are labeled as 20' in FIG. 21 and the remaining portions of the (100) Si layer are labeled as 62' in the drawing.

The blanket layer of dielectric material that is formed in this embodiment of the present disclosure is the same as the blanket layer of dielectric material 20 described above. The opening 66 can be formed using the technique, i.e., lithography and etching that was used in forming opening 22 in the structure shown in FIG. 4 of the present application. Opening 66 can have an aspect ratio within the range mentioned above for opening 22. In this embodiment, the opening 66 also exposes sidewall surfaces of the remaining portions of the (100) Si layer 62'.

Figure 22:
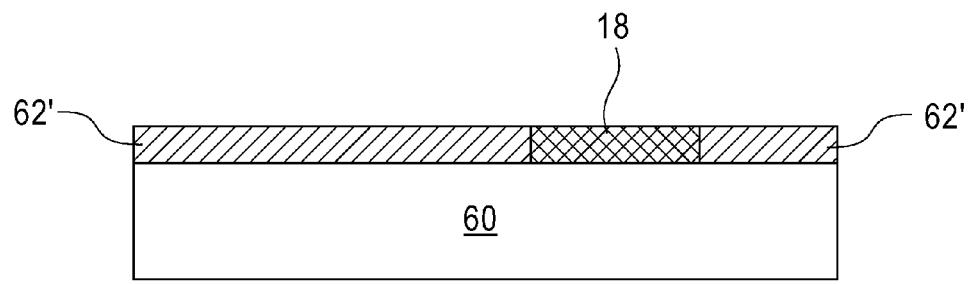
FIG. 22 is a pictorial representation (through a cross sectional view) illustrating the structure of FIG. 21 after forming a Group III nitride material layer from uppermost surface of the sapphire substrate and planarization.

Referring now to FIG. 22, there is illustrated after forming a Group III nitride material layer 18 from exposed sidewalls of the (100) Si layer and planarization. The Group III nitride material layer 18 that is formed in this embodiment includes one of the Group III nitride materials described above. Also, MOCVD as described above can be used here in forming Group III nitride material layer 18. The planarization process includes chemical mechanical planarization and/or grinding.

FIG. 22 illustrates a further semiconductor structure that can be formed in the present disclosure. In this embodiment, and as shown in FIG. 22, the structure that is provided includes a layer of sapphire 60; a patterned (100) silicon layer (i.e., remaining (100) Si layer 62') located on an uppermost surface of the layer of sapphire 60; and a Group III nitride material layer 18 located within an opening in the patterned (100) silicon layer and located on portion of the uppermost surface layer of sapphire. As shown, a portion of the Group III nitride material layer 18 is in direct contact with sidewalls of the patterned (100) silicon layer.

Figure 23:
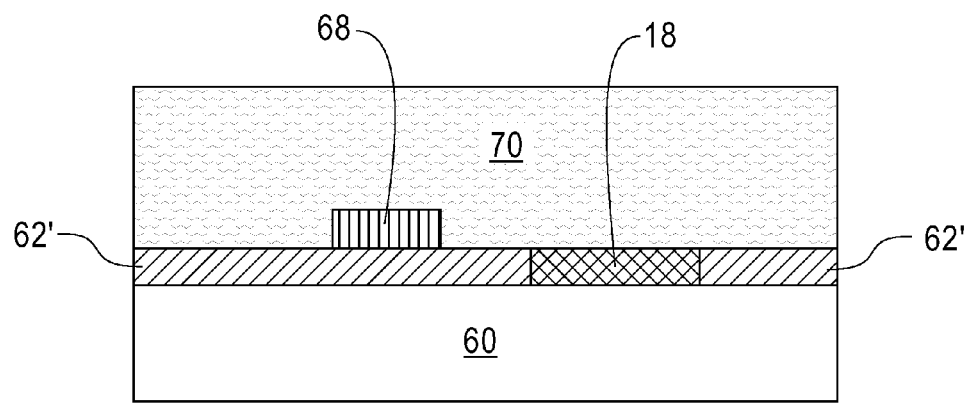
FIG. 23 is a pictorial representation (through a cross sectional view) illustrating the structure of FIG. 22 after formation of a semiconductor device upon and within a portion of the uppermost surface of the (100) Si layer and after forming an interconnect dielectric material.

After forming the structure shown in FIG. 23, semiconductor devices such as, for example, field effect transistors (FET), photonic devices (i.e., light emitting diodes or laser diodes) and combinations thereof, can be formed using conventional process that are well known to those skilled in the art. In some embodiments, the semiconductor devices can be formed upon and within the Group III nitride material layer 18 and/or the (100) Si layer 62'. FIG. 23, illustrates a semiconductor device 68 located upon a portion of the (100) Si layer 62'. When FETs are formed upon and within the Group III nitride material layer 18', a portion of the Group III nitride material layer 18' can serve as a device channel and a gate stack including at least a gate dielectric material and gate electrode can be formed above the device channel utilizing conventional silicon complementary metal oxide semiconductor (CMOS)-like processes. When FETs are formed upon and within the (100) Si layer 62', a portion of the (100) Si layer 62' can serve as a device channel and a gate stack including at least a gate dielectric material and gate electrode can be formed above the device channel utilizing conventional silicon complementary metal oxide semiconductor (CMOS)-like processes. An interconnect dielectric material 70 such as, for example, silicon oxide, and a SiCOH dielectric, can be formed after semiconductor device fabrication.

While the present disclosure has been particularly shown and described with respect to various embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A method of integrating a Group III nitride material and silicon, said method comprising:
providing a structure comprising, from bottom to top, a (100) silicon layer, a (111) silicon layer located on an uppermost surface of the (100) silicon layer, a Group III nitride material layer located on an uppermost surface of the (111) silicon layer, and a blanket layer of dielectric material located on an uppermost surface of the Group III nitride material layer;
forming an opening through the blanket layer of dielectric material, and the Group III nitride material layer to expose a portion of the uppermost surface of the (111) silicon layer;
performing an oxidation process to form an oxide plug within said exposed portion of the (111) silicon layer, wherein a bottommost surface of the oxide plug contacts the uppermost surface of the (100) silicon layer;
forming a conformal dielectric material liner atop remaining portions of the blanket layer of dielectric material and within said opening;
removing horizontal portions of said conformal dielectric material liner and a portion of said oxide plug to expose a portion of the uppermost surface of the (100) silicon layer;
forming an epitaxial semiconductor material on said exposed portion of the uppermost surface of the (100) silicon layer; and
removing portions of the epitaxial semiconductor material, and remaining portions of the blanket layer of dielectric material to expose the uppermost surface of remaining portions of the Group III nitride material layer.

2. The method of claim 1, further comprising a buried insulator layer located beneath and in contact with a bottommost surface of the (100) silicon layer, and a semiconductor substrate located beneath and in contact with a bottommost surface of the buried insulator layer.

3. The method of claim 2, wherein said Group III nitride material layer is formed on said uppermost surface of the (111) silicon layer by metalorganic chemical vapor deposition.

4. The method of claim 3, wherein said metalorganic chemical vapor deposition comprises introducing a Group III-containing precursor and a nitride precursor into a reactor chamber and depositing said precursors at a temperature of 850° C. or greater.

5. The method of claim 1, wherein a portion of said oxide plug and a portion of said conformal dielectric material liner remain within said opening and form a composite dielectric spacer, wherein a bottommost surface of the remaining portion of said oxide plug contacts an uppermost surface of said (100) silicon layer.

6. A semiconductor structure comprising:
a (100) silicon layer having an uppermost surface;
a buried insulator layer located on the uppermost surface of the (100) silicon layer;
a (111) silicon layer located on an uppermost surface of the buried insulator layer;
a patterned Group III nitride material layer located on an uppermost surface of the (111) silicon layer; and
an epitaxial semiconductor material layer located within an opening in said patterned Group III nitride material layer, wherein said epitaxial semiconductor material layer has a bottommost surface in direct contact with the uppermost surface of the (111) silicon layer, and an uppermost surface that is coplanar within the uppermost surface of said patterned Group III nitride material layer, and wherein sidewall surfaces of the epitaxial semiconductor material layer are separated from sidewall surfaces of said patterned Group III nitride material layer by a dielectric spacer.

\* \* \* \* \*